(12) United States Patent
Xie et al.

(10) Patent No.: US 11,404,141 B2
(45) Date of Patent: Aug. 2, 2022

(54) PREEMPTIVE READ REFRESH IN MEMORIES WITH TIME-VARYING ERROR RATES

(71) Applicant: Micron Technology, Inc., Boise, ID (US)

(72) Inventors: Tingjun Xie, Milpitas, CA (US); Zhengang Chen, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/301,747

(22) Filed: Apr. 13, 2021

(65) Prior Publication Data

US 2021/0233603 A1 Jul. 29, 2021

Related U.S. Application Data

(63) Continuation of application No. 16/533,498, filed on Aug. 6, 2019, now Pat. No. 11,004,534.

(51) Int. Cl.
*G11C 29/50* (2006.01)
*G06F 3/06* (2006.01)

(52) U.S. Cl.
CPC ...... *G11C 29/50012* (2013.01); *G06F 3/0604* (2013.01); *G06F 3/0655* (2013.01); *G06F 3/0689* (2013.01); *G11C 29/50004* (2013.01)

(58) Field of Classification Search
CPC ........ G11C 29/50012; G11C 29/50004; G11C 29/021; G11C 29/028; G11C 2029/0409; G11C 29/06; G06F 3/0604; G06F 3/0655; G06F 3/0689; G06F 11/1076; G06F 3/0619; G06F 3/0659
See application file for complete search history.

(56) References Cited

U.S. PATENT DOCUMENTS

| | | | |
|---|---|---|---|
| 2019/0294367 A1* | 9/2019 | Takada | G11C 16/28 |
| 2019/0362798 A1 | 11/2019 | Yang et al. | |
| 2020/0183783 A1 | 6/2020 | Xie et al. | |
| 2020/0226022 A1 | 7/2020 | Ide et al. | |

OTHER PUBLICATIONS

J. Stuecheli, D. Kaseridis, H. C.Hunter and L. K. John, "Elastic Refresh: Techniques to Mitigate Refresh Penalties in High Density Memory," 2010 43rd Annual IEEE/ACM International Symposium on Microarchitecture, Atlanta, GA, USA, 2010, pp. 375-384. (Year: 2010).*

I. Bayram, E., E. Eken, X. Wang, X. Sun, T.P. Ma and Y. Chen, "Adaptive Refresing and Read Voltage Control Scheme for FeDRAM", 2016 IEEE International Symposium on Circuits and Systems (ISCAS), Montreal, QC, 2016, pp. 1154-1157. (Year: 2016).

J. Lynch and P.P. Irazoqui, "A Low Power Logic-Compatible Multi-Bit Memory Bit Cell Architecture with Differential Pair and Current Stop Constructs", in IEEE Transactions on Circuits and Systems I: Regular Papers, vol. 61, No. 12, pp. 3367-3375, Dec. 2014 (Year: 2014).

* cited by examiner

*Primary Examiner* — Cynthia Britt
(74) *Attorney, Agent, or Firm* — Lowenstein Sandler LLP (57) ABSTRACT

A processing device in a memory sub-system determines a write-to-read delay time for a segment of a memory device read during a first read operation using a first read voltage level. The processing device further determines that the write-to-read delay time is associated with a second read voltage level and performs a read refresh operation on at least a portion of the segment of the memory device using the second read voltage level.

20 Claims, 6 Drawing Sheets

PREEMPTIVE READ REFRESH IN MEMORIES WITH TIME-VARYING ERROR RATES

RELATED APPLICATIONS

This application is a continuation of U.S. patent application Ser. No. 16/533,498, filed Aug. 6, 2019, the entire contents of which are hereby incorporated by reference herein.

TECHNICAL FIELD

Embodiments of the disclosure relate generally to memory sub-systems, and more specifically, relate to preemptive read refresh in memories with time-varying error rates.

BACKGROUND

A memory sub-system can be a storage system, a memory module, or a hybrid of a storage device and memory module. The memory sub-system can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various embodiments of the disclosure.

DETAILED DESCRIPTION

Aspects of the present disclosure are directed to preemptive read refresh in memories with time-varying error rates. A memory sub-system can be a storage device, a memory module, or a hybrid of a storage device and memory module. Examples of storage devices and memory modules are described below in conjunction with FIG. 1. In general, a host system can utilize a memory sub-system that includes one or more memory components. The host system can provide data to be stored at the memory sub-system and can request data to be retrieved from the memory sub-system.

A memory sub-system can include multiple memory components that can store data from a host system. When data is written to and/or erased from a memory cell of a memory component, the memory cell can be damaged to some extent. As the number of write operations and/or erase operations performed on a memory cell increases, the probability of the data stored at the memory cell including an error increases, and the memory cell is increasingly damaged. An increasing number of read and write operations can result in a higher error rate of the data stored at the memory cells. This can increase the use of error recovery operations, which includes but not is limited to read retry (i.e. sensing the memory component again) and RAID (redundant array of independent disks) for subsequent data operations (e.g., read and/or write) performed on the memory cell. The increased use of the error recovery operations can result in a reduction of the performance of a conventional memory sub-system. In addition, as the error rate continues to increase, it may even surpass the error recovery capabilities of the memory sub-system, leading to an irreparable loss of the data. Furthermore, as more resources of the memory sub-system are used to perform the error recovery operations, fewer resources are available to perform other read operations or write operations.

For certain memory types (i.e., for memory sub-systems employing certain types of storage media), the error rate can vary over time. In particular, some non-volatile memories have threshold voltage (Vt) distributions that move as a function of time (hereinafter referred to as 'intrinsic movement'). At a given read level (i.e., the voltage applied to a memory cell as part of a read operation), if the Vt distributions move, then certain reliability statistics can also be affected. One example of a reliability statistic is a raw bit error rate (RBER). The RBER can be defined as the ratio of the number of erroneous bits to the number of all data bits stored in a unit of the memory sub-system, where the unit can be the entire memory sub-system, a die of memory component, a collection of codewords, or any other meaningful portion of the memory sub-system. For any Vt distribution at an instance in time, there can be an optimal read voltage level (or read level range) that minimizes the expected RBER. In particular, the Vt distribution and RBER can be a function of write-to-read (W2R) delay (i.e., the period of time that passes between when data is written to a memory component and when the data is read from the memory component). Due to this time-varying nature of RBER, as well as other noise mechanisms in memory, a single read level may not be sufficient to achieve an error rate that satisfies certain system reliability targets. Thus, certain memory sub-systems may have a number of pre-programmed read voltage levels, each corresponding to a different range of W2R delay times. For example, a first read voltage level may be used to read data having a W2R delay time that falls within a first corresponding range, while a second read voltage level may be used to read data having a W2R delay time that falls within a second corresponding range, and so on.

Since the Vt distributions can be constantly affected by disturbances of self or neighboring cells, circuitry noise, temperature, etc., various refresh operations can be performed to restore the Vt distributions to a desired state. A write refresh operation, for example, may include rewriting the data of a memory cell, to either the same or a different physical memory location, in order to give the cell a clean slate free from serious intrinsic movement of Vt distributions, disturb effects and noises. The cell can be rewritten once or multiple times according to its current state (i.e., logical '0's' rewritten as logical '0's' and logical '1's' rewritten as logical '1's') or rewritten some even number of times with alternating states (i.e., the logical states reversed on a first rewrite and restored on a second rewrite). Write refresh operations are expensive in terms of sub-system performance and memory component endurance, however, so in conventional memory sub-systems, a read refresh operation may be preferred in certain circumstances. A read refresh operation involves reading the content of a memory cell to take advantage of a partial write effect that occurs with the read operation. For certain types of memory components, a read operation can change Vt distributions of the memory cells, which is also known as a partial write effect. For example, in a read operation, any cell voltage lower than and/or proximate to the applied read voltage can be physically pushed further away from the point of the read voltage. The result of read refresh performed at an optimal read voltage is the restoration of and additional separation between the Vt distributions, a larger read window budget (RWB) and improved RBER and robustness. Since it is possible that the optimal read voltages can gradually shift over time due to the intrinsic movement of Vt distributions, wear on the memory cells and changes to the physical and/or electrical characteristics of the memory cells, when suboptimal read voltage levels are used for the read refresh operation, however, the benefits of partial write effect are reduced. Accordingly, the separation of the Vt distributions may not be improved, thereby negating the advantages and rendering the read refresh operation ineffective. This can result in a decrease of performance of the memory sub-system, as well as an increase in the power consumption of the memory sub-system. System bandwidth and other resources can also be tied up for extended periods of time, preventing the use of those resources for other functionality.

Aspects of the present disclosure address the above and other deficiencies by performing preemptive read refresh operations in memories with time-varying error rates. In one implementation, when a read request is received (e.g., from a host connected to the memory sub-system), the memory sub-system reads the relevant memory segment using a first read voltage level (e.g., a lowest read voltage level when multiple read voltage levels are available) and attempts to decode the read data. If the decoding is successful, the memory sub-system can determine a W2R delay time based on a write timestamp present in the decoded data and identify the optimal read voltage level for the W2R delay time (i.e., the applicable read voltage level). If the first read voltage level does not match the optimal read voltage level, the memory subsystem may perform a read refresh operation on at least a portion of the memory segment. This read refresh operation is another read operation performed using the optimal applicable read voltage level and can be considered as preemptive since it is performed even though the data read during the first read operation has been successfully decoded and can be returned to the requestor. In addition, the read refresh operation can be performed as a preventive measure against read failure rather than as a repair operation performed after read failure of the segment has occurred. This read refresh operation may be performed using the optimal read voltage level in order to take advantage of the partial write effect attributable to the read refresh operation. Accordingly, the separation of the Vt distributions may be improved, and the memory segment is more fully refreshed making it less vulnerable to subsequent disturbs and other noises. In addition, the preemptive read refresh operation improves the overall health of the memory sub-system by reducing the RBER and needed read retry rate, as well as the quality of service provided to the host, such as improved throughput, latency, and reliability. Furthermore, the impairment to system performance and endurance is minimized compared to conventional write refresh and inadequate read refresh techniques.

Figure 1:
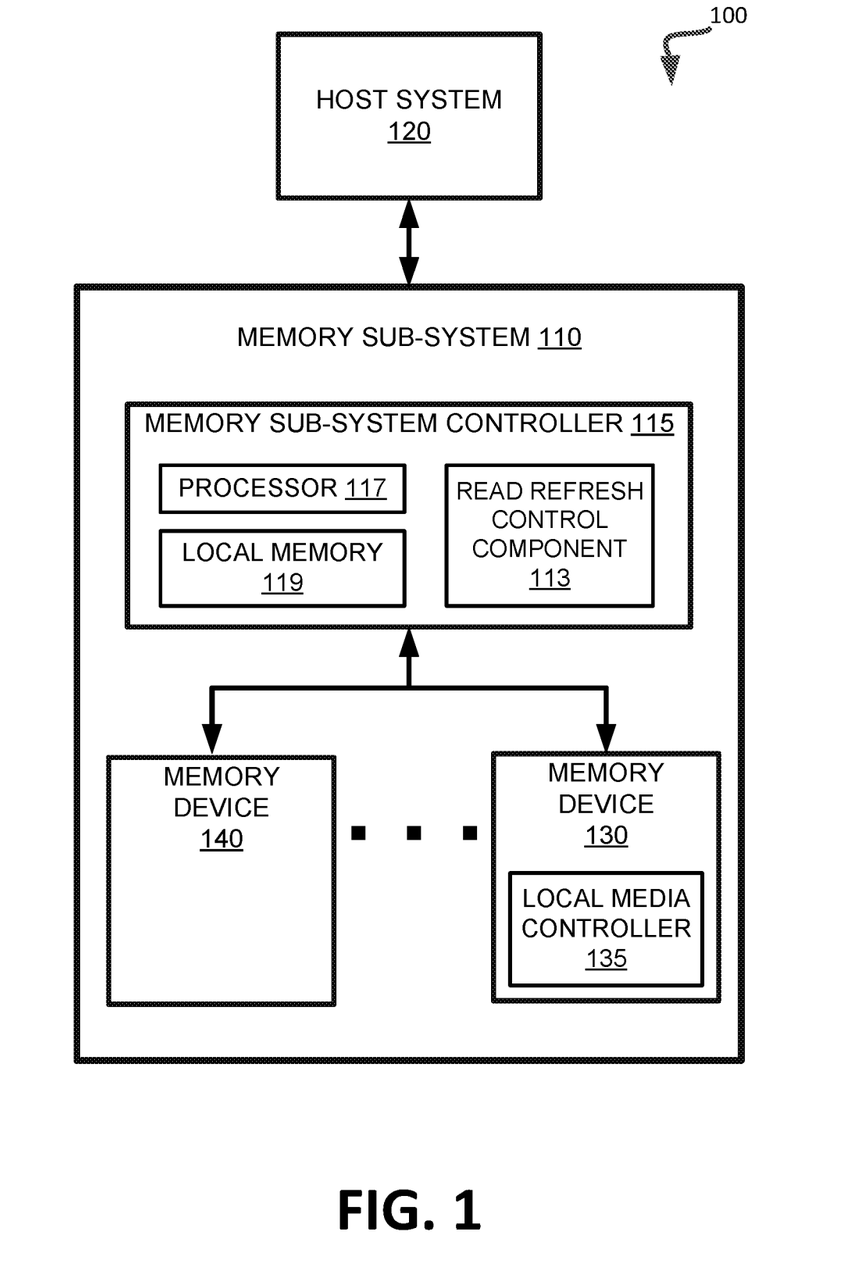
FIG. 1 illustrates an example computing environment that includes a memory sub-system in accordance with some embodiments of the present disclosure.

FIG. 1 illustrates an example computing environment 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

The computing environment 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. The host system 120 uses the memory sub-system 110, for example, to write data to the memory sub-system 110 and read data from the memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can be a computing device such as a desktop computer, laptop computer, network server, mobile device, embedded computer (e.g., one included in a vehicle, industrial equipment, or a networked commercial device), or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory devices 130 when the memory sub-system 110 is coupled with the host system 120 by the PCIe interface. The physical host interface can provide an interface for passing control, address, data, and other signals between the memory sub-system 110 and the host system 120.

The memory devices can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

An example of non-volatile memory devices (e.g., memory device 130) includes a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased.

Although non-volatile memory components such as 3D cross-point type memory are described, the memory device 130 can be based on any other type of non-volatile memory, such as negative-and (NAND), read-only memory (ROM), phase change memory (PCM), self-selecting memory, other chalcogenide based memories, ferroelectric random access memory (FeRAM), magneto random access memory (MRAM), negative-or (NOR) flash memory, and electrically erasable programmable read-only memory (EEPROM).

The cells can store one or more bits per cell. In one embodiment, each of the memory devices 130 can include one or more arrays of memory cells such as single level cells (SLCs), multi-level cells (MLCs), triple level cells (TLCs), or quad-level cells (QLCs), or a combination of such. In some embodiments, a particular memory component can include an SLC portion, and an MLC portion, a TLC portion, or a QLC portion of memory cells. Each of the memory cells can store one or more bits of data used by the host system 120. Furthermore, the memory cells of the memory devices 130 can be grouped as memory pages that can refer to a unit of the memory component used to store data. Some non-volatile memory devices can group pages across dice and channels to form management units (MUs).

The memory sub-system controller 115 can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor (processing device) 117 configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 may not include a memory sub-system controller 115, and may instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical block address and a physical block address that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130.

In some embodiments, the memory devices 130 are managed memory devices (e.g., managed NAND), which is a raw memory device combined with a local controller (e.g., local controller 135) for memory management within the same memory device package.

The memory sub-system 110 includes a read refresh control component 113 that can be used to perform preemptive read refresh operations on memory devices 130 having time-varying error rates. In one implementation, controller 115 in memory subsystem 110 can receive a read request from host system 120, from some other device connected to memory sub-system 110 or from some other component within memory sub-system 110. The read request can identify data stored in a segment of one of memory devices 130. The segment may be any physical or logical portion of the memory component, such as one or a collection of codewords, or a management unit, for example.

Read refresh control component 113 may perform a preemptive read refresh operation on a relevant segment of the memory devices 130 when appropriate in order to improve performance in the memory sub-system 110. For example, controller 115 can receive a read request from host system 120, the read request identifying data stored in a segment of one of memory devices 130. Read refresh control component 113 can performs a first read operation on the segment of the memory component using a first read voltage level. The first read voltage level can be, for example, a lowest read voltage level of multiple available read voltage levels in memory sub-system 110. Read refresh control component 113 determines whether the data stored in the segment of the memory component and read during the first read operation was successfully decoded (i.e., whether an error level in the data stored in the segment of the memory component and read during the first read operation was less than an error correcting capability of the memory sub-system 110). If the data stored in the segment of the memory component and read during the first read operation is successfully decoded, read refresh control component 113 can return the decoded data to host system 120, determine a write-to-read delay time for the segment of the memory component and determine whether the write-to-read delay time for the segment falls within a first write-to-read delay range corresponding to the first read voltage level. In one embodiment, the write-to-read delay time represents a difference between a first time when the data was written to the segment and a second time when the read request identifying the data was issued to the memory component. If the write-to-read delay time for the segment does not fall within the first write-to-read delay range, read refresh control component 113 performs a read refresh operation on the segment of the memory component using an applicable read voltage level. The read refresh operation is performed to take advantage of the partial write effect that occurs with the applicable read voltage level. Due to physical characteristics of the memory component, the partial write effect can cause voltages programmed in one state (e.g., logical high or low) to be physically pushed further away from voltages in the other state resulting in additional separation between the Vt distributions, a larger read window budget (RWB) and improved RBER and robustness. Further details with regards to the operations of the read refresh control component 113 are described below.

Figure 2:
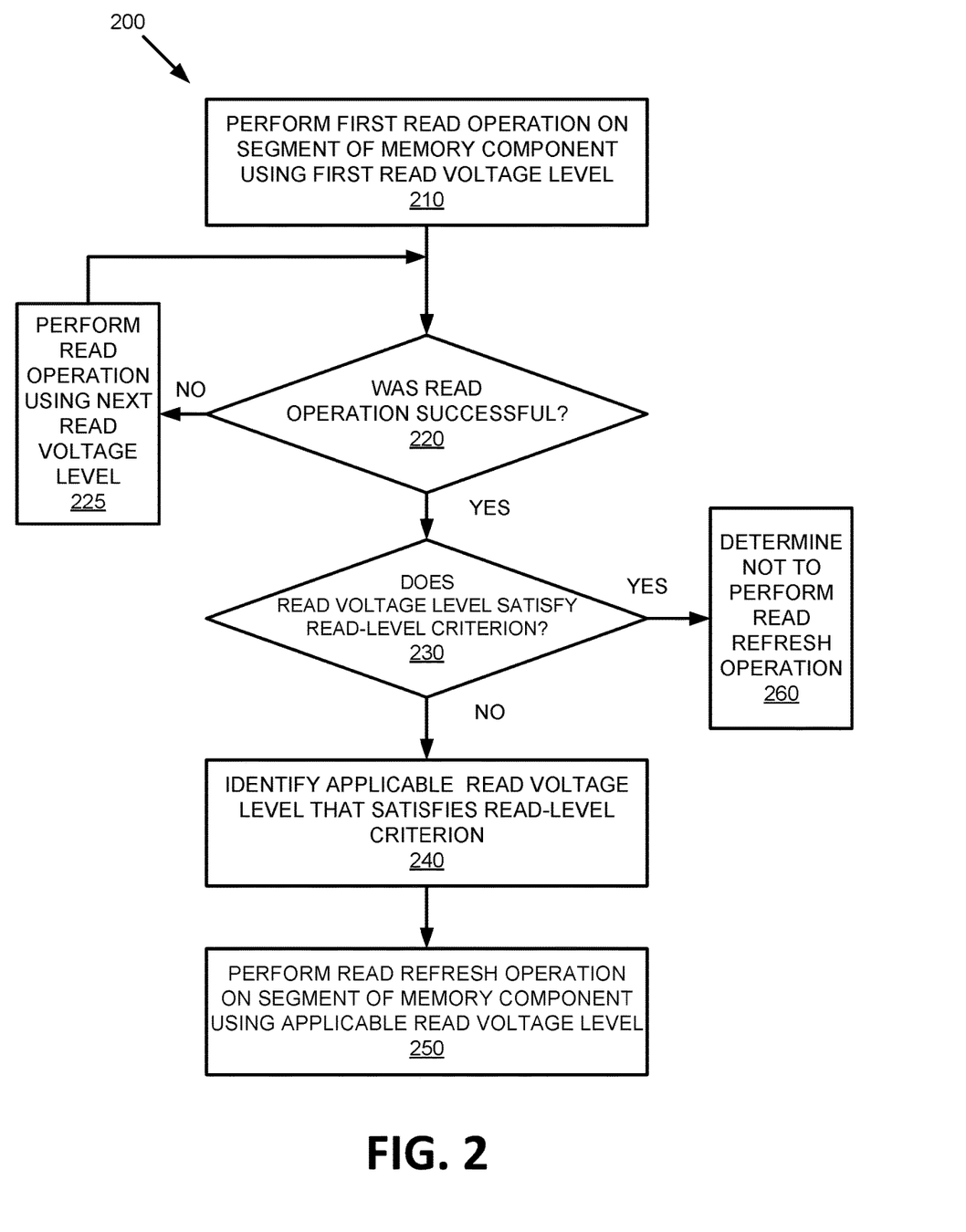
FIG. 2 is a flow diagram of an example method of performing preemptive read refresh in memories with time-varying error rates in accordance with some embodiments of the present disclosure.

FIG. 2 is a flow diagram of an example method of performing preemptive read refresh in memories with time-varying error rates in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the read refresh control component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 210, the processing logic performs a first read operation on a segment of one of memory devices 130 using a first read voltage level. In one implementation, the first read voltage level is a lowest read voltage level among multiple read voltage levels available in memory sub-system 110. In one implementation, performing the read operation can include applying a signal with the first read voltage level to one or more memory cells in the segment to be read and determining a state of the memory cells, where this state can be decoded to provide the data stored therein.

At operation 220, the processing logic determines whether the first read operation performed using the first read voltage level was successful. In one implementation, read refresh control component 113 attempts to decode the data read during the first read operation and, if the decoding is successful, determines that the first read operation was successful. The data is generally able to be decoded when an error level in the read data is less than an error correcting capability of the controller 115.

If the first read operation performed using the first read voltage level was unsuccessful, at operation 225, the processing logic performs another read operation (e.g., a second read operation) using a next read voltage level to attempt to recover data again. In one implementation, the next read voltage level is a next highest read voltage level among the multiple read voltage levels than the read voltage level that was used in the previous read operation. For example, read refresh control component 113 may use a second read voltage level to read and attempt to recover data again if the first read operation was unsuccessful. This process may continue with additional read voltage levels (e.g., a third read voltage level, a fourth read voltage level, etc.) until a read operation is successfully performed. If all of the read voltage levels available in the memory sub-system are used without a read operation being successfully performed, the process can fail.

Figure 3:
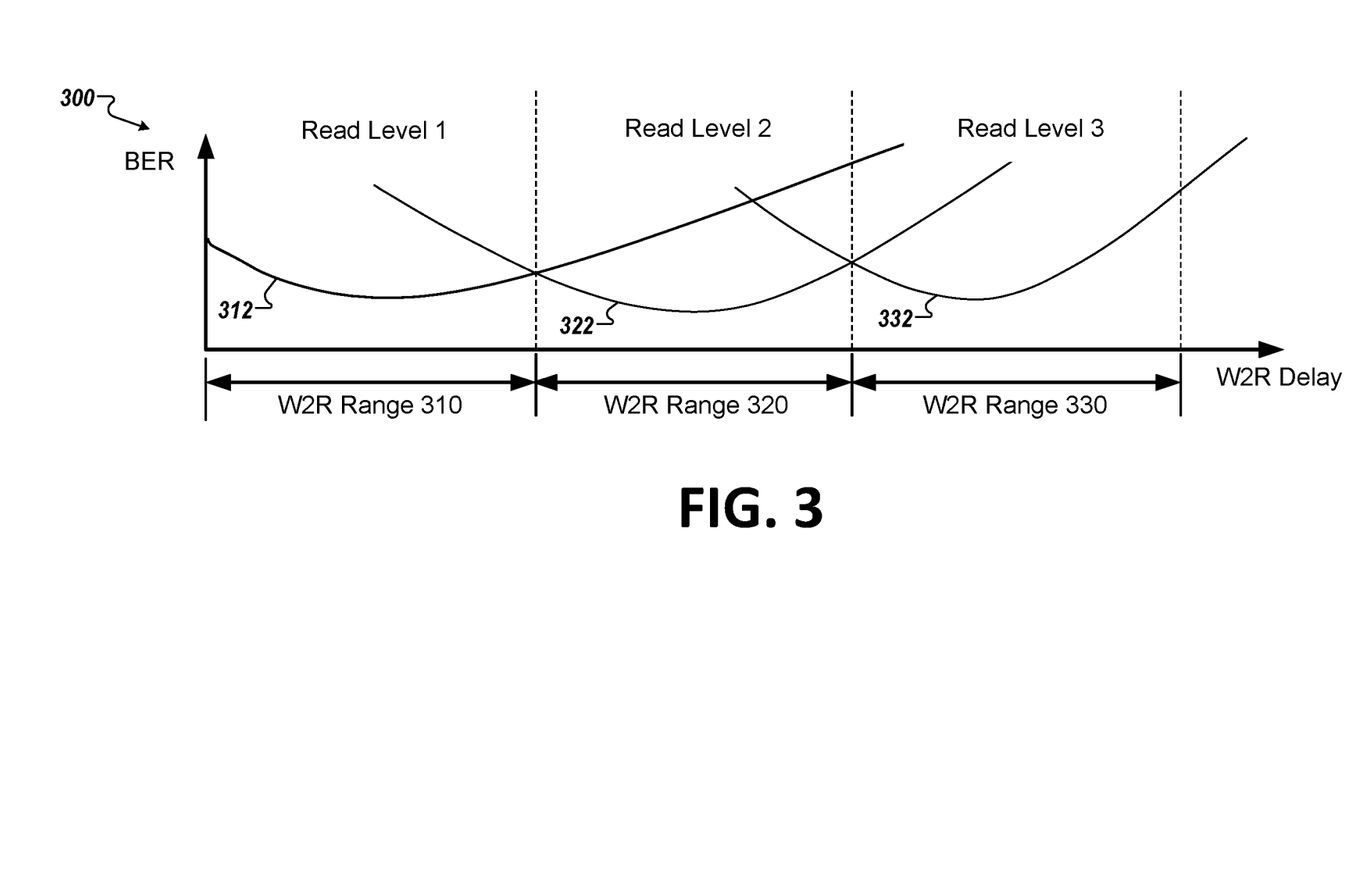
FIG. 3 is a graph that illustrates the bit error rate as a function of write-to-read delay for three read voltage levels in accordance with some embodiments of the present disclosure.

Once a read operation is successfully performed, at operation 230, the processing logic determines whether the corresponding read voltage level satisfies a read-level criterion. In one implementation, the read-level criterion pertains to a write-to-read delay time for the segment of the memory component, as illustrated in FIG. 3. FIG. 3 is a graph 300 that illustrates the bit error rate (BER) as a function of write-to-read (W2R) delay for three read voltage levels in accordance with some embodiments of the present disclosure. As described herein, Vt distributions can shift over time. For example, for a given read voltage level, such as a first read voltage level (labeled Read Level 1), the bit error rate experienced when read operations are performed using this read voltage level can change as a function of time due to the intrinsic movement of Vt distributions. Similarly, the corresponding bit error rates of the second read voltage level (labeled Read Level 2) or the third read voltage level (labeled Read Level 3) can also change as a function of time. In these or other situations, the Vt distribution and bit error rate can be a function of the W2R delay. Graph 300 shows that each of the three read voltage levels correspond to a different range of W2R delay times, such as W2R Range 310, W2R Range 320, and W2R Range 330, which can be design targets from memory sub-system specifications. In other embodiments, there may be any other number of ranges of W2R delay times and associated read voltage levels. In graph 300, the measured BER is displayed for read operations performed using a designated read voltage level. For example, BER curve 312 represents the BER measured for read operations performed using Read Level 1 on segments of different W2R delay times, BER curve 322 represents the BER measured for read operations performed using Read Level 2 on segments of different W2R delay times, and BER curve 332 represents the BER measured for read operations performed using Read Level 3 on segments of different W2R delay times. It is evident from graph 300 that using Read Level 1 results in a lower BER for read operations performed on segments of the memory component having W2R delay times that fall within W2R Range 310, using Read Level 2 results in a lower BER for read operations performed on segments of the memory component having W2R delay times that fall within W2R Range 320, and using Read Level 3 results in a lower BER for read operations performed on segments of the memory component having W2R delay times that fall within W2R Range 330. Graph 300 also illustrates that for a single read level (e.g., Read Level 2), the BER increases at lower W2R delay times (i.e., W2R Range 310) and at higher W2R delay times (i.e., W2R Range 330). In one implementation, Read Level 1 is the lowest voltage, Read Level 2 has a higher voltage than Read Level 1, and Read Level 3 has a higher voltage than Read Level 2. The values of Read Level 1, Read Level 2, and Read Level 3 may be set during production of the memory component, but may optionally be adjusted during the lifetime of the memory component.

Referring again to FIG. 2, to determine whether the corresponding read voltage level satisfies a read-level criterion at operation 230, the processing logic can determine whether the write-to-read delay time for the segment falls within a write-to-read delay range corresponding to the read voltage level. Assuming, for example, that at operation 220 the processing logic determines that Read Level 1 was used to successfully perform the read operation, the processing logic can determine whether the write-to-read delay time for the segment falls within W2R Range 310. If the write-to-read delay time for the segment falls within W2R Range 310, then read refresh control component 113 can determine that the read-level criterion is satisfied. If, however, the write-to-read delay time for the segment falls outside W2R Range 310 (e.g., in W2R Range 320 or W2R Range 330), then read refresh control component 113 can determine that the read-level criterion is not satisfied. If other read voltage levels are used (e.g., Read Level 2, Read Level 3) read refresh control component 113 can determine that the read-level criterion is satisfied if the write-to-read delay time falls within a corresponding write-to-read delay range (i.e., W2R Range 320 and W2R Range 330, respectively).

If read refresh control component 113 determines that the read-level criterion is not satisfied, at operation 240, the processing logic identifies an applicable read voltage level that does satisfy the read-level criterion. In one implementation, read refresh control component 113 identifies the applicable read voltage level having a corresponding write-to-read delay range into which the write-to-read delay time for the segment falls. For example, after the read data is successfully decoded with Read Level 1, if the determined write-to-read delay time for the segment falls into W2R Range 320, read refresh control component 113 can identify Read Level 2 as satisfying the read-level criterion for this segment of the memory devices 130 (and thus using Read Level 2 as the applicable read voltage level). Similarly, if the write-to-read delay time for the segment falls into W2R Range 330, read refresh control component 113 can identify Read Level 3 as satisfying the read-level criterion.

At operation 250, the processing logic performs a read refresh operation on at least a portion of the segment of one of memory devices 130 using the applicable read voltage level (e.g., Read Level 2) identified at operation 240. In one implementation, performing the read refresh operation can include applying a signal with the applicable read voltage level to one or more memory cells in the segment to be read. The read refresh operation is performed to take advantage of the partial write effect that occurs with the read operation. The partial write effect can cause voltages programmed in one state (e.g., logical high or low) to be physically pushed further away from voltages in the other state resulting in additional separation between the Vt distributions, a larger read window budget (RWB) and improved RBER and robustness.

Depending on the embodiment, read refresh control component 113 can perform the read refresh operation on the entire memory segment or on a portion of the memory segment. For example, in a memory subsystem implementing Redundant Array of Independent Disks (RAID), a RAID stripe may include segments or portions of segments (e.g., codewords) from multiple LUNs, or separate memory components. In one embodiment, read refresh control component 113 can perform a preemptive read refresh operation on one or more individual codewords in the RAID stripe (e.g., on one or a subset of a plurality of codewords in the RAID stripe). For example, due to variation between memory dies, or temperature changes, only certain codewords in the RAID stripe may suffer errors. Thus, if one codeword in the RAID stripe failed ECC decoding, but is recovered using the RAID scheme, read refresh control component 113 can perform a preemptive read refresh operation on that one codeword only. Furthermore, there can be some amount of overlap between W2R delay ranges corresponding to different read voltage levels (e.g., Read Level 1 and Read Level 2). In such an overlap region, neither of the different read voltage levels may be considered optimal for performing a read refresh operation. Accordingly, read refresh control component 113 can perform the read refresh operation on only one or more codewords that satisfy a certain criterion (e.g., ECC decoding status, etc.).

If read refresh control component 113 determines, at operation 230, that the read-level criterion is satisfied, at operation 260, the processing logic determines not to perform a read refresh operation.

Figure 4A:
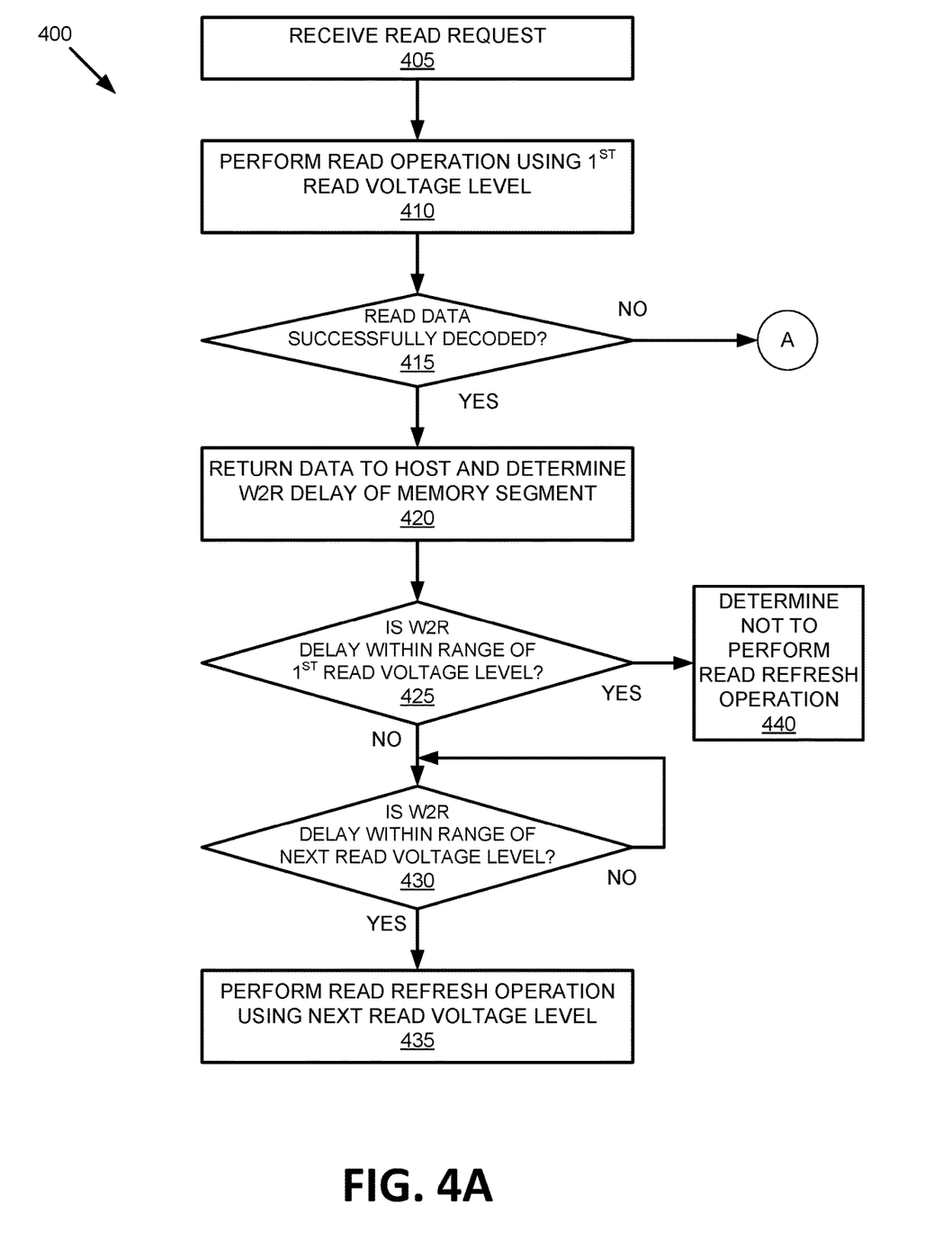
FIGS. 4A and 4B are flow diagrams of an example method of performing preemptive read refresh in memories with time-varying error rates in accordance with some embodiments of the present disclosure.
Figure 4B:
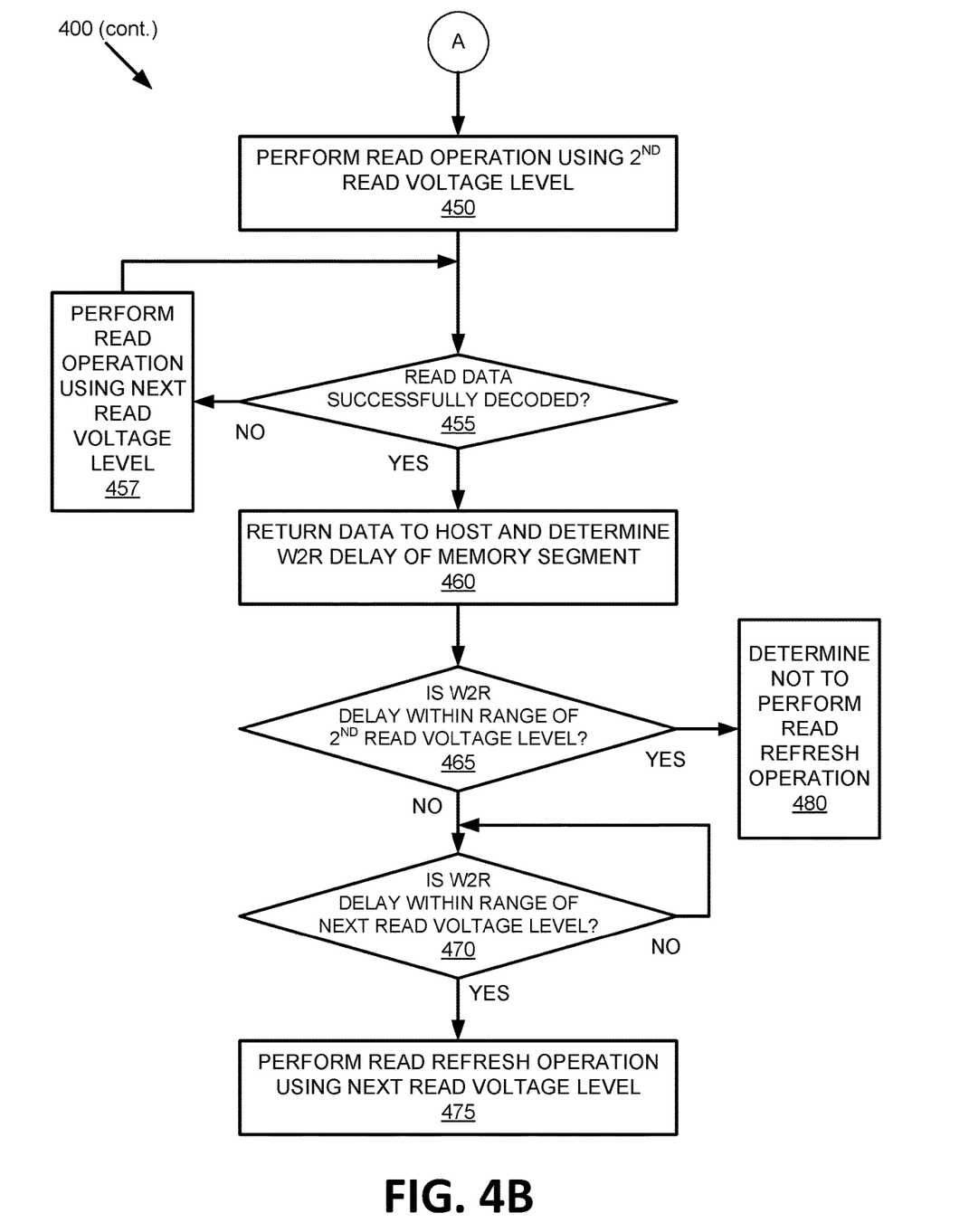

FIGS. 4A and 4B are flow diagrams of an example method of performing preemptive read refresh in memories with time-varying error rates in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the read refresh control component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 405, the processing logic receives a read request from a host system 120, or from some other component of the memory sub-system 110. In one implementation, the read request identifies data stored in a segment of a memory component. The segment may be any physical or logical portion of the memory component, such as one or a plurality of codewords.

At operation 410, the processing logic performs a first read operation on the segment of the memory component using a lowest read voltage level (e.g., Read Level 1). In one implementation, performing the read operation can include applying a signal with the lowest read voltage level to one or more memory cells in the segment to be read and determining a state of the memory cells, where this state can be decoded to provide the data stored therein.

At operation 415, the processing logic attempts to decode the data read during the first read operation and determines whether the decoding is successful. In general, the decoding is successful when an error level in the read data is less than an error correcting capability of the controller 115. If the read data is not successfully decoded (i.e., if the error level in the read data exceeds the error correcting capability of controller 115), processing proceeds to "A" and is further illustrated in FIG. 4B. If the read data is successfully decoded, however, processing proceeds to operation 420.

At operation 420, the processing logic returns the data stored in the segment of the memory component and read during the first read operation to the host system 120 (and optionally processed by error-correcting code (ECC) to detect and correct any data corruption) and determines a write-to-read delay time for the data stored in the segment. In one implementation, read refresh control component 113 reads a timestamp stored with the data in the segment of the memory component, the timestamp indicating a time at which the data was written. In another implementation, the time that the data was written is stored in some other data store separate from the memory component, such as in local memory 119 of the controller 115. In either case, read refresh control component 113 can determine a difference between the write time indicated by the timestamp and the current time (or a time when the read request was received at operation 405), where that difference represents the write-to-read delay time for the segment.

At operation 425, the processing logic determines whether the write-to-read delay time for the segment falls within a first write-to-read delay range (e.g., W2R Range 310) corresponding to the first read voltage level (e.g., Read Level 1). In one implementation, read refresh control component 113 compares the write-to-read delay time determined at operation 420 to the first write-to-read delay range. If the write-to-read delay time is greater than or equal to a lower boundary of W2R Range 310 and less than or equal to an upper boundary of W2R Range 310, read refresh control component 113 can determine that the write-to-read delay time falls within W2R Range 310. If the write-to-read delay time is less than the lower boundary of W2R Range 310 or greater than the upper boundary of W2R Range 310, read refresh control component 113 can determine that the write-to-read delay time does not fall within W2R Range 310.

If read refresh control component 113 determines that the write-to-read delay time does not fall within W2R Range 310, at operation 430, the processing logic determines whether the write-to-read delay time for the segment falls within a next write-to-read delay range (e.g., W2R Range 320) corresponding to a next read voltage level (e.g., Read Level 2). In one implementation, the next read voltage level is the next highest read voltage level than the one used in the previous read operation. If the write-to-read delay time for the segment falls within the next write-to-read delay range (e.g., W2R Range 320), at operation 435, the processing logic performs a read refresh operation using the next read voltage level (e.g., Read Level 2) on at least a portion of the memory segment. Note that the next read voltage level here is also the applicable read voltage level. In one implementation, performing the read refresh operation can include applying a signal with the next read voltage level to one or more memory cells in the segment to be read. This read refresh operation is performed to take advantage of the partial write effect that occurs with the read operation. If the write-to-read delay time for the segment does not fall within the next write-to-read delay range (e.g., W2R Range 320), processing can return to operation 430 and check for any additional write-to-read delay ranges (e.g., W2R Range 330) and corresponding read voltage levels (e.g., Read Level 3). If read refresh control component 113 determines that the write-to-read delay time falls within one of these additional write-to-read delay ranges, read refresh control component 113 can perform a read refresh operation using the corresponding (applicable) read voltage level, which has a write-to-read delay range into which the write-to-read delay time for the segment falls. Depending on the embodiment, read refresh control component 113 can perform the preemptive read refresh operation on the entire memory segment or on only a portion of the memory segment (e.g., on one or more individual codewords in a RAID stripe).

If read refresh control component 113 determines, at operation 425, that the write-to-read delay time for the segment falls within W2R Range 310, at operation 440, the processing logic determines not to perform a read refresh operation.

Referring to FIG. 4B, if the read data is not successfully decoded at operation 415, processing proceeds to "A" and operation 450. At operation 450, the processing logic performs a second read operation on the segment of the memory component using a next read voltage level (e.g., Read Level 2). In one implementation, the next read voltage level is the next highest read voltage level than the one used in the previous read operation. In one implementation, performing the read operation can include applying a signal with Read Level 2 to one or more memory cells in the segment to be read and determining a state of the memory cells, where this state can be decoded to provide the data stored therein.

At operation 455, the processing logic attempts to decode the data read during the second read operation and determines whether the decoding is successful. In general, the decoding is successful when an error level in the read data is less than an error correcting capability of the controller 115. If the read data is not successfully decoded (i.e., if the error level in the read data exceeds the error correcting capability of controller 115), at operation 457, the processing logic performs another read operation (e.g., a third read operation) using a next read voltage level. In one implementation, the next read voltage level is a next highest read voltage level among the multiple read voltage levels than the read voltage level that was used in the previous read operation. For example, read refresh control component 113 may use a third read voltage level to read and recover data again for the third read operation. This process may continue with additional read voltage levels (e.g., a fourth read voltage level, a fifth read voltage level, etc.) until a read operation is successfully performed. If all of the read voltage levels available in the memory sub-system are used without a read operation being successfully performed, the process can fail. Once the read data is successfully decoded, processing proceeds to operation 460.

At operation 460, the processing logic returns the data stored in the segment of the memory component and read during the second read operation to the host system 120 (and optionally processed by error-correcting code (ECC) to detect and correct any data corruption) and determines a write-to-read delay time for the data stored in the segment. At operation 465, the processing logic determines whether the write-to-read delay time for the segment falls within a second write-to-read delay range (e.g., W2R Range 320) corresponding to the second read voltage level (e.g., Read Level 2).

If read refresh control component 113 determines that the write-to-read delay time does not fall within W2R Range 320, at operation 470, the processing logic determines whether the write-to-read delay time for the segment falls within a next write-to-read delay range (e.g., W2R Range 330) corresponding to a next read voltage level (e.g., Read Level 3). In one implementation, the next read voltage level is the next highest read voltage level than the one used in the previous read operation. If the write-to-read delay time for the segment falls within W2R Range 330, at operation 475, the processing logic performs a read refresh operation using Read Level 3 on at least a portion of the memory segment. This read refresh operation is performed to take advantage of the partial write effect that occurs with the read operation. If the write-to-read delay time for the segment does not falls within W2R Range 330, the processing logic can return to operation 470 and check for any additional write-to-read delay ranges and corresponding read voltage levels. Depending on the embodiment, read refresh control component 113 can perform the preemptive read refresh operation on the entire memory segment or on only a portion of the memory segment (e.g., on one or more individual codewords in a RAID stripe).

If read refresh control component 113 determines, at operation 465, that the write-to-read delay time for the segment falls within W2R Range 320, at operation 480, the processing logic determines not to perform a read refresh operation. The example described above with respect to FIGS. 4A and 4B is relevant to a memory sub-system having three separate read voltage levels. It should be understood that although specific read voltage levels and write-to-read delay ranges are described for purposes of explanation, similar operations may be performed using other read voltage levels and write-to-read delay ranges. For example, in a memory sub-system having additional read voltage levels, certain operations of method 400 may be performed to assess the appropriateness of a given read voltage level and a corresponding write-to-read delay range, and read refresh operations may be performed using any of those additional read voltage levels.

As described above, one metric used to determine when to perform a preemptive read refresh operation on a segment of a memory component (and whether the optimal read voltage level was used) is the write-to-read delay time. In other implementations, however, other metadata available in the memory sub-system may be used to make a similar determination. For example, read refresh control component 113 can consider, in addition or in the alternative, temperature data, such as the temperature when the segment was written, the temperature when the segment is read, or temperature history between when the segment was written and read. Read refresh control component 113 can further consider other operations performed on the segment and the order in which they occur between when the segment was written and read, or the wear level (i.e., the number of total operations performed on the segment). This metadata can either be embedded in a metadata section of the segment (i.e., stored with the data) or available from elsewhere, such as a memory management system. Any of these other metadata parameters, or a combination of multiple, can be used either with or without the write-to-read delay information to determine whether an inadequate read refresh has been performed, whether a preemptive read refresh should be performed, and what read voltage level should be used.

Figure 5:
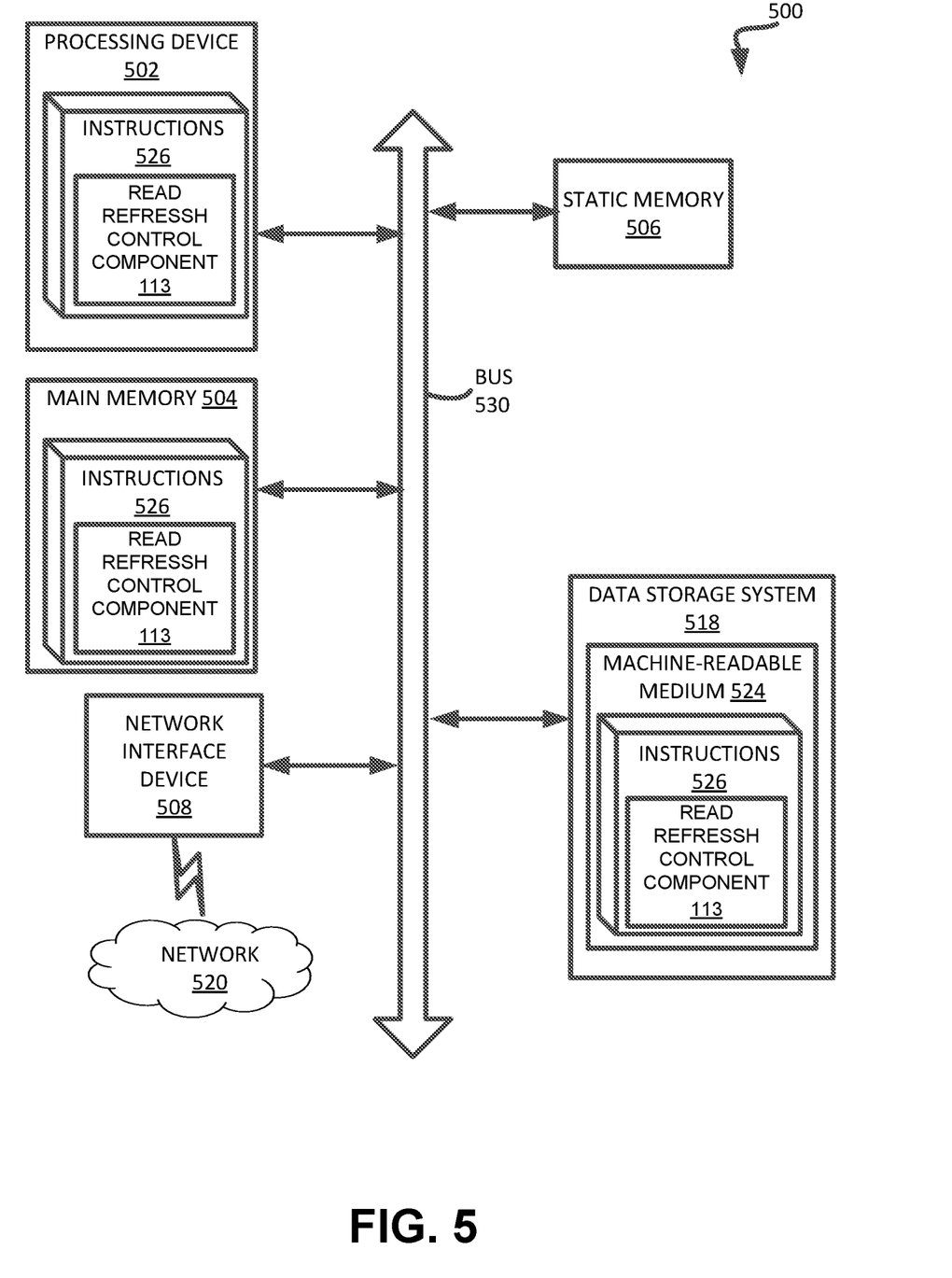
FIG. 5 is a block diagram of an example computer system in which embodiments of the present disclosure may operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the read refresh control component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to the read refresh control component 113 of FIG. 1. While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
    a memory device; and
    a processing device, operatively coupled with the memory device, to perform operations comprising:
        determining a write-to-read delay time for a segment of the memory device read during a first read operation using a first read voltage level;
        determining that the write-to-read delay time is associated with a second read voltage level; and
        performing a read refresh operation on at least a portion of the segment of the memory device using the second read voltage level.

2. The system of claim 1, wherein performing the read refresh operation on the at least the portion of the segment of the memory device comprises performing the read refresh operation on a subset of a plurality of codewords in a RAID stripe across the memory device, wherein the subset of the plurality of codewords fail to be decoded and are recovered using RAID.

3. The system of claim 1, wherein the first read voltage level is a lowest read voltage level of a plurality of read voltage levels associated with the memory device, and wherein the write-to-read delay time represents a difference between a first time when the data was written to the segment and a second time when a read request identifying data stored in the segment was issued to the memory device.

4. The system of claim 3, wherein determining the write-to-read delay time for the segment of the memory device comprises reading a timestamp stored with the data in the segment of the memory device, the timestamp indicating the first time when the data was written.

5. The system of claim 1, wherein the processing device is to perform operations further comprising:
    returning data stored in the segment of the memory device and read during the first read operation to a host system prior to the read refresh operation.

6. The system of claim 1, wherein the processing device is to perform operations further comprising:
    determining whether data stored in the segment of the memory device and read during the first read operation was successfully decoded;
    responsive to the data stored in the segment of the memory device and read during the first read operation not being successfully decoded, performing a second read operation on the segment of the memory device using the second read voltage level.

7. The system of claim 6, wherein the second read voltage level is higher than the first read voltage level.

8. The system of claim 6, wherein the processing device is to perform operations further comprising:
    determining whether the data stored in the segment of the memory device and read during the second read operation was successfully decoded; and
    responsive to the data stored in the segment of the memory device and read during the second read operation being successfully decoded, determining the write-to-read delay time for the segment of the memory device.

9. A method of operation of a memory sub-system comprising:
    determining a write-to-read delay time for a segment of a memory device of the memory sub-system read during a first read operation using a first read voltage level;

determining that the write-to-read delay time is associated with a second read voltage level; and performing a read refresh operation on at least a portion of the segment of the memory device using the second read voltage level.

10. The method of claim 9, wherein performing the read refresh operation on the at least the portion of the segment of the memory device comprises performing the read refresh operation on a subset of a plurality of codewords in a RAID stripe across the memory device, wherein the subset of the plurality of codewords fail to be decoded and are recovered using RAID.

11. The method of claim 9, wherein the first read voltage level is a lowest read voltage level of a plurality of read voltage levels associated with the memory device, and wherein the write-to-read delay time represents a difference between a first time when the data was written to the segment and a second time when a read request identifying data stored in the segment was issued to the memory device.

12. The method of claim 11, wherein determining the write-to-read delay time for the segment of the memory device comprises reading a timestamp stored with the data in the segment of the memory device, the timestamp indicating the first time when the data was written.

13. The method of claim 9, wherein the processing device is to perform operations further comprising:

determining whether data stored in the segment of the memory device and read during the first read operation was successfully decoded;

responsive to the data stored in the segment of the memory device and read during the first read operation not being successfully decoded, performing a second read operation on the segment of the memory device using the second read voltage level, wherein the second read voltage level is higher than the first read voltage level.

14. The method of claim 13, wherein the processing device is to perform operations further comprising:

determining whether the data stored in the segment of the memory device and read during the second read operation was successfully decoded; and responsive to the data stored in the segment of the memory device and read during the second read operation being successfully decoded, determining the write-to-read delay time for the segment of the memory device.

15. A non-transitory computer-readable storage medium comprising instructions that, when executed by a processing device, cause the processing device to perform operations comprising:

determining a write-to-read delay time for a segment of the memory device read during a first read operation using a first read voltage level;

determining that the write-to-read delay time is associated with a second read voltage level; and performing a read refresh operation on at least a portion of the segment of the memory device using the second read voltage level.

16. The non-transitory computer-readable storage medium of claim 15, wherein performing the read refresh operation on the at least the portion of the segment of the memory device comprises performing the read refresh operation on a subset of a plurality of codewords in a RAID stripe across the memory device, wherein the subset of the plurality of codewords fail to be decoded and are recovered using RAID.

17. The non-transitory computer-readable storage medium of claim 15, wherein the first read voltage level is a lowest read voltage level of a plurality of read voltage levels associated with the memory device, and wherein the write-to-read delay time represents a difference between a first time when the data was written to the segment and a second time when a read request identifying data stored in the segment was issued to the memory device.

18. The non-transitory computer-readable storage medium of claim 17, wherein determining the write-to-read delay time for the segment of the memory device comprises reading a timestamp stored with the data in the segment of the memory device, the timestamp indicating the first time when the data was written.

19. The non-transitory computer-readable storage medium of claim 15, wherein the instructions cause the processing device to perform operations further comprising:

determining whether data stored in the segment of the memory device and read during the first read operation was successfully decoded;

responsive to the data stored in the segment of the memory device and read during the first read operation not being successfully decoded, performing a second read operation on the segment of the memory device using the second read voltage level, wherein the second read voltage level is higher than the first read voltage level.

20. The non-transitory computer-readable storage medium of claim 19, wherein the instructions cause the processing device to perform operations further comprising:

determining whether the data stored in the segment of the memory device and read during the second read operation was successfully decoded; and responsive to the data stored in the segment of the memory device and read during the second read operation being successfully decoded, determining the write-to-read delay time for the segment of the memory device.

* * * * *